United States Patent

Konishi et al.

Patent Number: 5,475,873
Date of Patent: Dec. 12, 1995

[54] RECTIFICATION FEEDBACK HIGH FREQUENCY CIRCUIT ARRANGEMENT INCLUDING AN ADAPTIVE FILTER

[75] Inventors: Yoshihiro Konishi, Sagamihara; Masami Ohsaki, Chiba; Kazuo Maeda, Tokyo, all of Japan

[73] Assignee: Uniden Corporation, Ichikawa, Japan

[21] Appl. No.: 24,304

[22] Filed: Mar. 1, 1993

[30] Foreign Application Priority Data

Mar. 4, 1992 [JP] Japan .................... 4-047066

[51] Int. Cl.⁶ ............... H01Q 11/12; H04B 1/04
[52] U.S. Cl. .......... 455/126; 455/127; 375/345
[58] Field of Search .................. 455/307, 126, 455/115, 116, 234.1, 234.2, 249.1, 127; 330/129, 132, 135, 107, 109, 289; 375/60, 68, 71, 296, 309, 312, 345

[56] References Cited

U.S. PATENT DOCUMENTS

| | | | |
|---|---|---|---|
| 4,553,105 | 11/1985 | Sasaki | 455/249.1 |
| 4,910,799 | 3/1990 | Takayama | 455/296 |
| 4,996,500 | 2/1991 | Larson et al. | 455/126 |
| 5,128,629 | 7/1992 | Trinh | 330/129 |
| 5,179,353 | 1/1993 | Miyake | 330/129 |
| 5,196,806 | 3/1993 | Ichihara | 455/126 |
| 5,337,006 | 8/1994 | Miyazaki | 455/116 |

*Primary Examiner*—Reinhard J. Eisenzopf
*Assistant Examiner*—Lisa Charouel
*Attorney, Agent, or Firm*—Stevens, Davis, Miller & Mosher

[57] ABSTRACT

To prevent variation of a transmission band characteristic which is caused by variation of operational conditions (e.g., temperature in the rectification feedback amplification) in a system with large extraband attenuation for sharply cutting off the transmission band in each channel of the communication system including plural narrow band channels allotted close to each other, rectification feedback is effected through through an adaptive filter. A band characteristic of the adaptive filter is varied in response to the variation of operational conditions including temperature, while data processing is rapidly effected through digital signal processing. Consequently, even if the communications in each channels are intermittently repeated, each time the communication is reopened, the desired transmission band characteristic can be instantly fixed, so as to prevent the disturbance of stable operation by adjudicating the interference through data correlation.

20 Claims, 5 Drawing Sheets

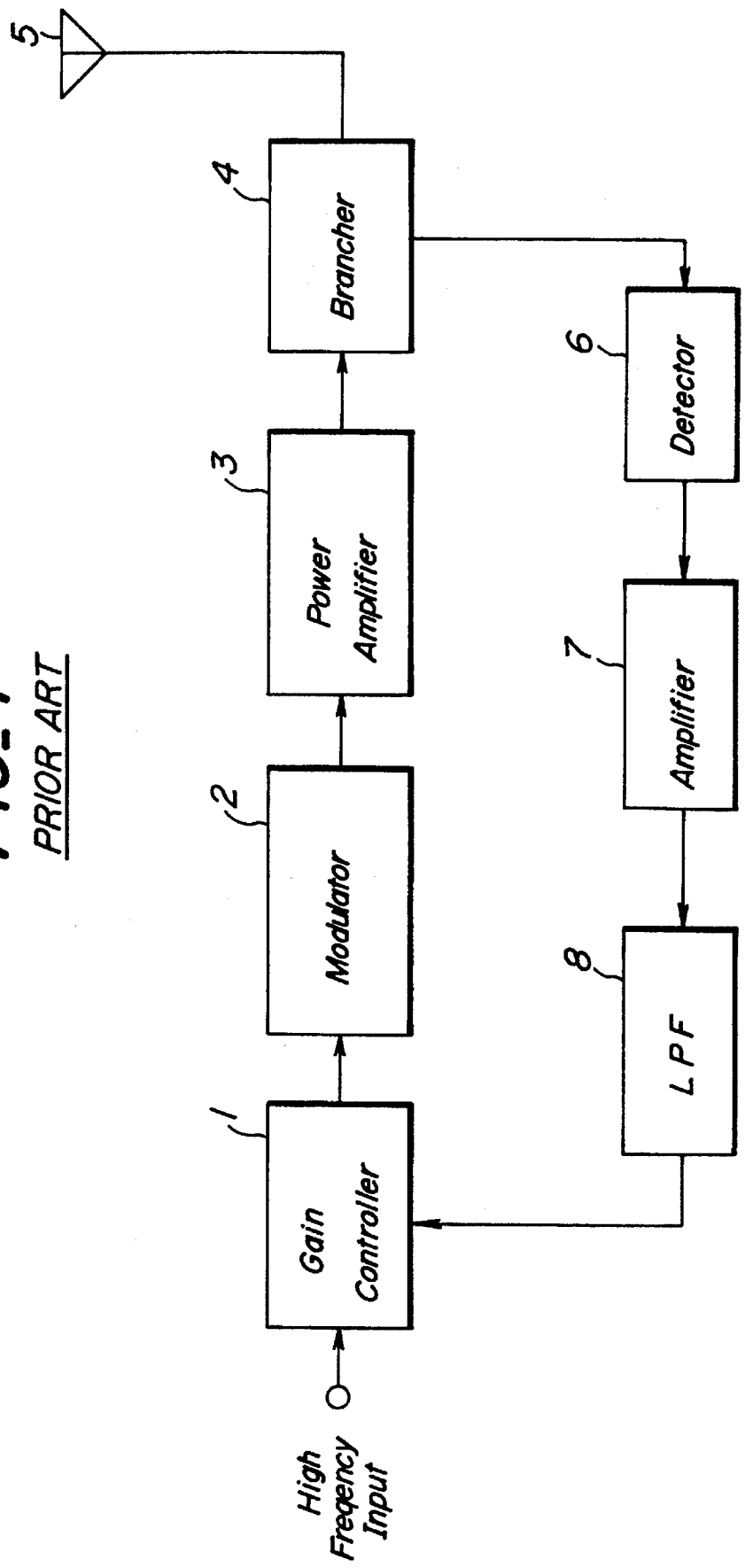
FIG. 1 *PRIOR ART*

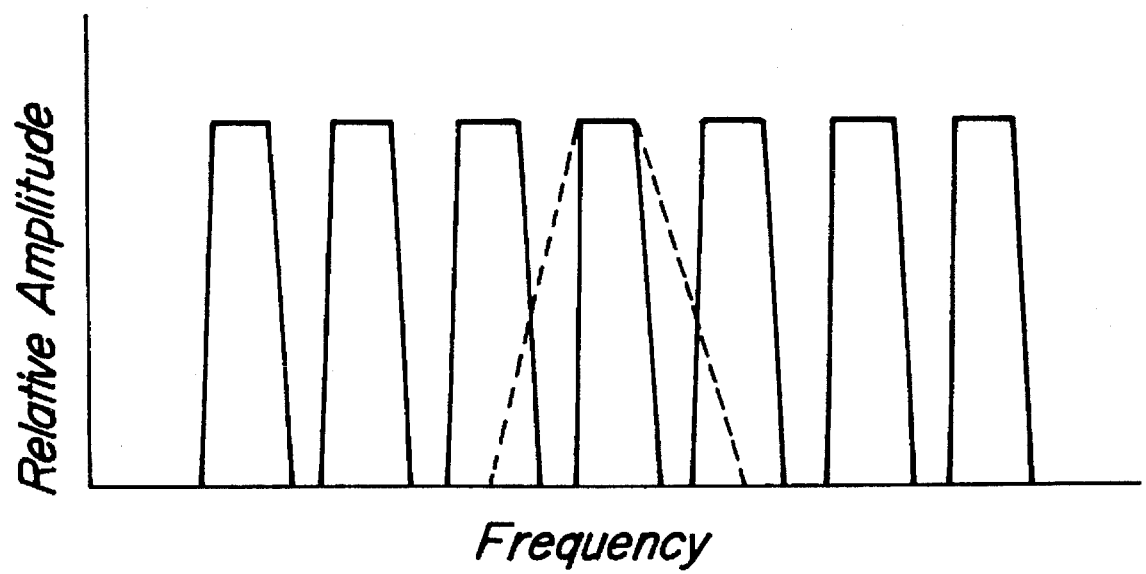
FIG_2

5,475,873

RECTIFICATION FEEDBACK HIGH FREQUENCY CIRCUIT ARRANGEMENT INCLUDING AN ADAPTIVE FILTER

BACKGROUND OF THE INVENTION

1. Field of the Invention

The present invention relates to a rectification feedback high frequency circuit arrangement for sharply cutting off transmission bands of each channel in repeated communications of sounds, data and the like through plural narrow-band channels allotted close to each other, and particularly, so as to immediately fix a suitable transmission band property adapted to the variation of operational conditions (e.g. temperature), each time the repeated communication is reopened.

2. Description of Related Art

For instance, in sound communications, data communications and the like of press-talk type, plural narrow-band channels close to each other are allotted thereto. As a result, it is required in each of the transmission channels to sharply cut off both sides of each of the transmission bands for to prevent mutual interference. Therefore, in the communication apparatus of this kind, the rectification feedback which facilitates the sharp cut off of both sides of the transmission bands is generally effected by feeding-back with an adequate gain an envelope signal obtained by the rectifying detection of a partly branched transmission output high frequency signal through a low pass filter having an adequate band characteristic, so as to attain a desired narrow band transmission property.

However, the utilization of communications of this kind is recently remarkably increased, and hence plural allotted transmission channels are entirely used in practice without any vacant channels. As a result, the interference between adjacent narrow band transmission channels through narrow guard-bands has caused practical troubles. Consequently, it is required for removing interference between adjacent channels to extremely increase the attenuation on both sides of the transmission bands by increasing the feedback rate of conventionally adopted rectification feedback.

However, in the case that the required narrow band transmission property can be attained by the rectification feedback at this high feedback rate, for instance, between an interval immediately after the reopening of intermittent transmission and a subsequent transmission interval, temperature, applied voltage and the like in each of the circuit elements are varied, even if slightly, and hence the transmission band characteristic, which has been attained by the rectification feedback at high rate, is varied thereby. As a result, transmission obstacles, (e.g. immediately after the opening of press-talk, the aforesaid interference between adjacent channels is caused) are increased. Consequently, the prevention of these communication obstacles, particularly, of adjacent channel interference caused by the variation of transmission band characteristic at the reopening of transmission has been a conventional problem to be solved.

SUMMARY OF THE INVENTION

An object of the present invention is to solve the above conventional problem and to provide a rectification feedback high frequency circuit arrangement in which the narrow-band transmission characteristic having a sharp cut-off property is attained through rectification feedback, and hence, even immediately after the reopening of the intermittent transmission, the required transmission band characteristic can be kept.

For the above, a rectification feedback high frequency circuit arrangement according to the present invention, where an input to output frequency characteristic of a high frequency signal circuit concerned is controlled by feeding back an envelope signal, which is obtained by applying a rectifying detection on an output high frequency signal of said high frequency signal circuit, to an input side of the high frequency signal circuit at least through a low pass filter, is featured in that the input to output frequency characteristic of the high frequency signal circuit is adapted to an operational condition of the circuit arrangement concerned by varying a pass band characteristic of the low pass filter in response to the operational condition of the circuit arrangement concerned.

BRIEF DESCRIPTION OF THE DRAWINGS

For the better understanding of the invention, reference is made to the accompanying drawings, in which:

FIG. 1 is a block diagram showing an example of an outlined arrangement of a rectification feedback high frequency circuit arrangement in general;

FIG. 2 is a diagram schematically showing an example of a channel arrangement of communications of sounds, data and the like in which plural narrow band transmission channels are arranged closely to each other;

Figure 3A:
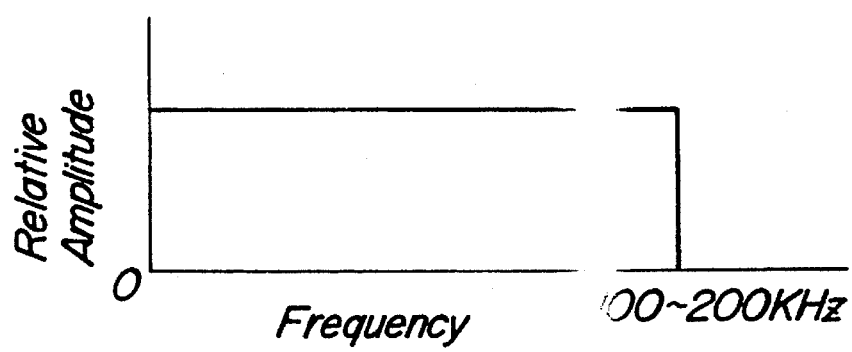
FIGS. 3($a$), 3($b$) and 3($c$) are characteristic curves each showing examples of transmission band characteristic of an original high frequency circuit arrangement, the same in which a conventional rectification feedback is applied thereon, and the same in which a rectification feedback is applied according to the present invention, respectively.
Figure 3B:
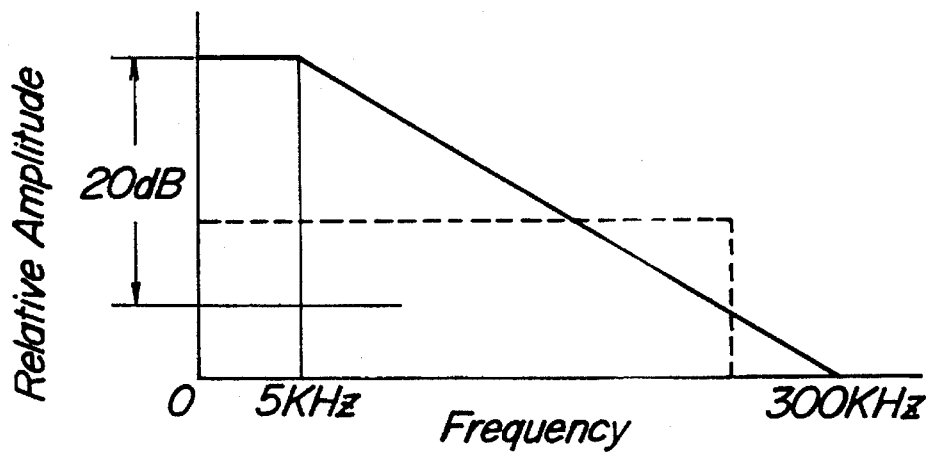

Throughout different views of the drawings, 1 is a gain controller; 2 is a modulator; 3 is a power amplifier; 4 is a brancher; 5 is an antenna; 6 is a detector; 7 is an amplifier; 8 is a low pass filter (LPF); 9 is a high frequency circuit; 10 is an adaptive filter; 11 is a data analyzer; 12 is a memory; 13 is a comparator (a correlator); 14 is an adjudicator; 15 is a coefficient setter; 16 is an analog to digital converter (A/D); 17 is a digital signal processing arrangement (DSP); and 18 is a digital to analog converter (D/A).

DESCRIPTION OF THE PREFERRED EMBODIMENTS

Embodiments of the present invention will be described in detail hereinafter by referring to the accompanying drawings.

At the outset, as for an embodiment in the case that the present invention is applied on a sound transmitter, an outlined arrangement of a general rectification feedback high frequency circuit arrangement is shown in FIG. 1. In this outlined rectification feedback sound transmitter, an input high frequency carrier signal is supplied to a modulator 2 through a gain controller 1, for instance, an attenuator, so as to be, for instance, amplitude-modulated with a sound signal, a resultant modulated high frequency output signal obtained through a power amplifier 3 is supplied to an antenna 5 through a brancher 4, so as to be transmitted. Meanwhile, the high frequency output signal partly derived from the brancher 4 is supplied to a detector 6, a resultant envelope signal obtained through rectifying detection is fed back to the gain controller 1 at an adequate feedback rate so as to control the gain of the input high frequency signal, successively through an amplifier 7 having an adequate gain and a low pass filter 8 having a flat pass band consisting of a required transmission band, and, as a result, an attenuation characteristic appropriately inclined at the outside of the required transmission band should be obtained.

In communication of this kind, as shown schematically in FIG. 2, plural narrow band transmission channels are successively adjacent to each other through narrow guard bands. As a result, it is required as for the transmission band characteristic of each channels to provide extremely sharp band attenuation characteristic as shown by solid lines in FIG. 2, and hence the required transmission band characteristic is attained by correcting the original band characteristic as shown by dotted lines in FIG. 2 through the aforesaid rectification feedback.

In other words, the original high frequency signal transmission circuit, for instance, in a sound transmitter from the high frequency input terminal to the antenna 5 as shown in FIG. 1 is afforded a flat wide-band characteristic extended to a few hundreds kHz as shown in FIG. 3(a). This wide band high frequency transmission circuit is applied with rectification feedback, so as to conventionally obtain an attenuation of 20 to 30 dB in a range of 100 to 200 kHz outside of the required transmission band, for instance, of 5 kHz.

Figure 3C:
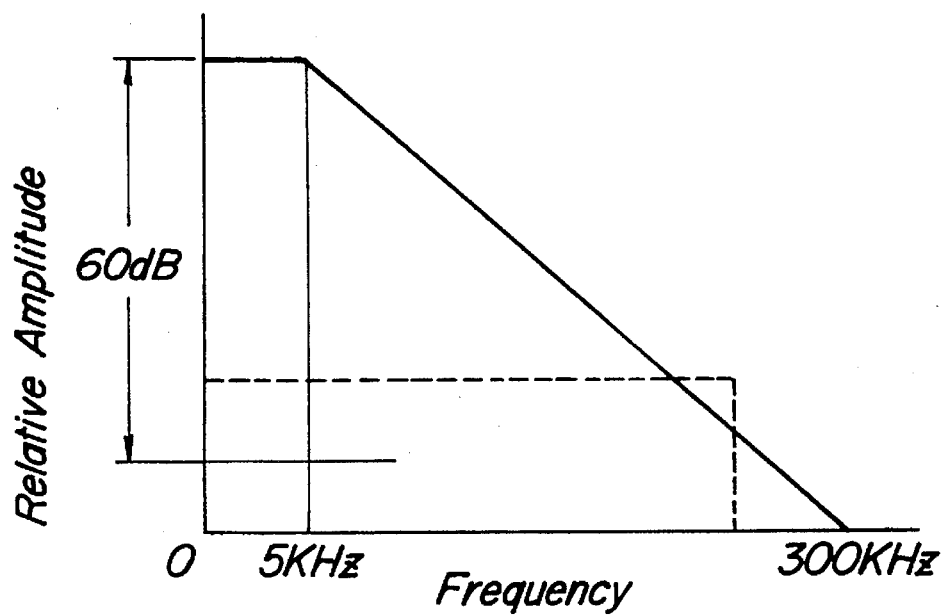

However, as described earlier, the utilization of communication of this kind has recently increased, so that, in the state where the interference between adjacent channels practically causes troubles, it is required to increase the feedback rate of rectification feedback, so as to obtain an extremely sharp and large attenuation, for instance, of 60 dB in a range of 300 kHz outside of the necessary transmission band through the rectification feedback, as shown in FIG. 3(c).

On the other hand, in the case that, in a state where through thus extensive attenuation the required attenuation outside of the transmission band is obtained, for instance, circuit constants of constituents of the filter 8 composing the rectification feedback circuit are varied in response to temperature variation, and, as a result, the transmission band characteristic of the filter 8 is varied, for instance, as shown by dotted lines in FIG. 3(c), the practical transmission band characteristic of each channel is widened, and hence the interference between adjacent channels is instantly increased. Particularly, for instance, in press-talk type transceivers, each time the transmission is intermittently reopened, temperature in the vicinity of the transmitting circuit is varied between the initial interval and the subsequent interval for transmission. Consequently, even if the adjustment is effected so as to obtain the required transmission band characteristic in the stabilized transmission interval, the variation of practical transmission band is caused immediately after the reopening of transmission.

In the rectification feedback high frequency circuit arrangement according to the present invention, the variation of transmission band characteristic, which is caused by the variation of operational conditions of circuit elements, for instance, of the operational temperature or applied voltage, including the aforesaid variation of transmission band immediately after the reopening of transmission, should be canceled by the variation of characteristics or circuit constants corresponding to the variation of different transmission band adjusting means on the same operational condition, so as to safely and steadily maintain the required transmission band characteristic. For attaining the above, for instance, as shown in FIG. 4, an adaptive filter is inserted in the rectification feedback circuit as for the transmission band adjusting means varying the property in correspondence to the variation of operational conditions.

Figure 4:
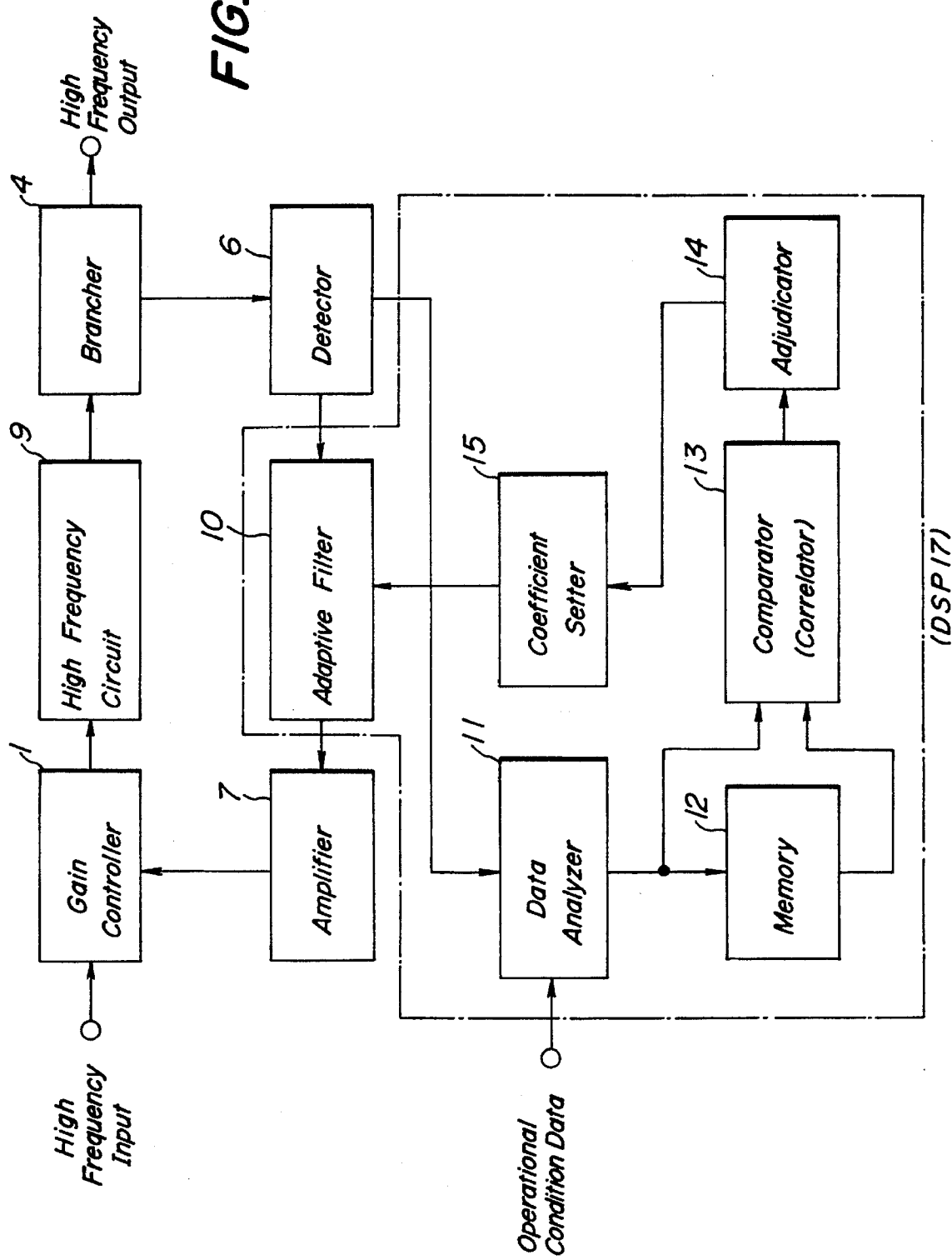
FIG. 4 is a block diagram showing an example of an outlined arrangement of a rectification feedback high frequency circuit arrangement according to the present invention.

In the rectification feedback high frequency circuit arrangement according to the present invention, which is outlined as shown in FIG. 4, the input high frequency carrier signal is supplied to the high frequency circuit 9 through the gain controller 1, for instance, the attenuator, so as to be applied with the desired signal processing including amplification, modulation and the like, the resultant processed high frequency signal being derived from the output terminal through the brancher 4. Meanwhile, the high frequency output signal partially derived from the brancher 4 is supplied to the detector 6, so as to be applied with the rectifying detection, the resultant envelope signal thereof being derived.

In the circuit arrangement of the present invention as shown in FIG. 4, similarly as the general rectification feedback high frequency circuit arrangement as shown in FIG. 1, the rectifying detection output envelope signal derived from the detector 6 is supplied to the aforesaid adaptive filter 10, that is, a filter in which individually adjustable coefficients of multistage transmission property deciding elements are varied by an external control signal, similarly as the transversal filter, so as to vary the transmission property in response to required operational conditions, if necessary, through a preceding analog to digital (A/D) converter and a subsequent digital to analog (D/A) converter, such as adapted to the transmission band characteristic responding to the operational conditions, and thereafter is fed back to the gain controller 1 through the amplifier 7 having adequate gain.

In this circuit arrangement of the present invention as shown in FIG. 4, rectification feedback control having transmission band characteristic which is similar to that of the conventional circuit is effected, while the rectifying detection output envelope signal is supplied to a data analyzer 11 also, so as to analyze necessary data of the envelope signal concerned including wave form distortion, frequency component content rate and signal to noise ratio together with external supplied operational condition data including operation temperature and applied voltage. The resultant data of operational conditions, for instance, data corresponding to operational conditions of the entire circuit arrangement, in which desired transmission band characteristics can be obtained in stable operation, is memorized in a memory 12.

Thereafter, for instance, similar data of operational conditions at the beginning of subsequent transmission reopening in a press-talk type sound transmission are supplied to a comparator 13, while those in stable operation which are derived from the memory 12 are supplied to the same comparator 13 also, so as to be compared with each other. The result of mutual comparison of operational condition data between different operational conditions or different instants of operation in the comparator 13 is supplied to an adjudicator 14. The result of this adjudication, in which any significant difference worthy to correct the transmission band characteristic of the entire circuit arrangement between these different data is recognized or is not recognized, is supplied to a coefficient setter 15, so as to always maintain the entire transmission band characteristic as desired by correcting or not correcting respective coefficients of each transmission property deciding elements in the adaptive filter 10 in response to the above significant differences.

In this connection, in the circuit arrangement of the present invention which is operated as described above, in case that an undesired high frequency signal generated by the interference or the like provisionally enters therein from the output terminal, the signal wave form of the envelope signal derived from the detector 6 is evidently different from that in stable operation as a matter of course. On the other hand, in case that, as mentioned above, the operational conditions including temperature at the initial interval of reopened transmission in the press-talk type sound transmission are different from those in stable operation, these differences of operational conditions are comparatively slight, so that, as for the result of comparison of operational conditions in the comparator 13, a correlation of a certain level is recognizable between both of operational conditions. Meanwhile, the data of operational conditions caused by the penetration of interfering waves are remarkably different from that in stable operation and hence any correlation should be scarcely recognizable.

Consequently, in the circuit arrangement of the present invention as outlined in FIG. 4, in the case that, as a result of comparison of operational conditions in the comparator 13, it is adjudicated that no correlation is recognizable between both operational conditions, for preventing the disturbance of the entire transmission band characteristic which is caused by the interference, urgent processings, such as the faculty of transmission property correction of the adaptive filter 10 is stopped, for instance, by making the coefficient setter 15 inoperative, are carried out.

On the other hand, the adaptive correction of transmission band characteristic in the entire circuit arrangement of the present invention as outlined in FIG. 4 is required to be extremely rapidly effected each time the press-talk type intermittent transmission is reopened, so as to attain the stable operation with desired transmission band characteristic from the beginning of reopened transmission, so that it is required to extremely rapidly process the data of operational conditions.

Figure 5:
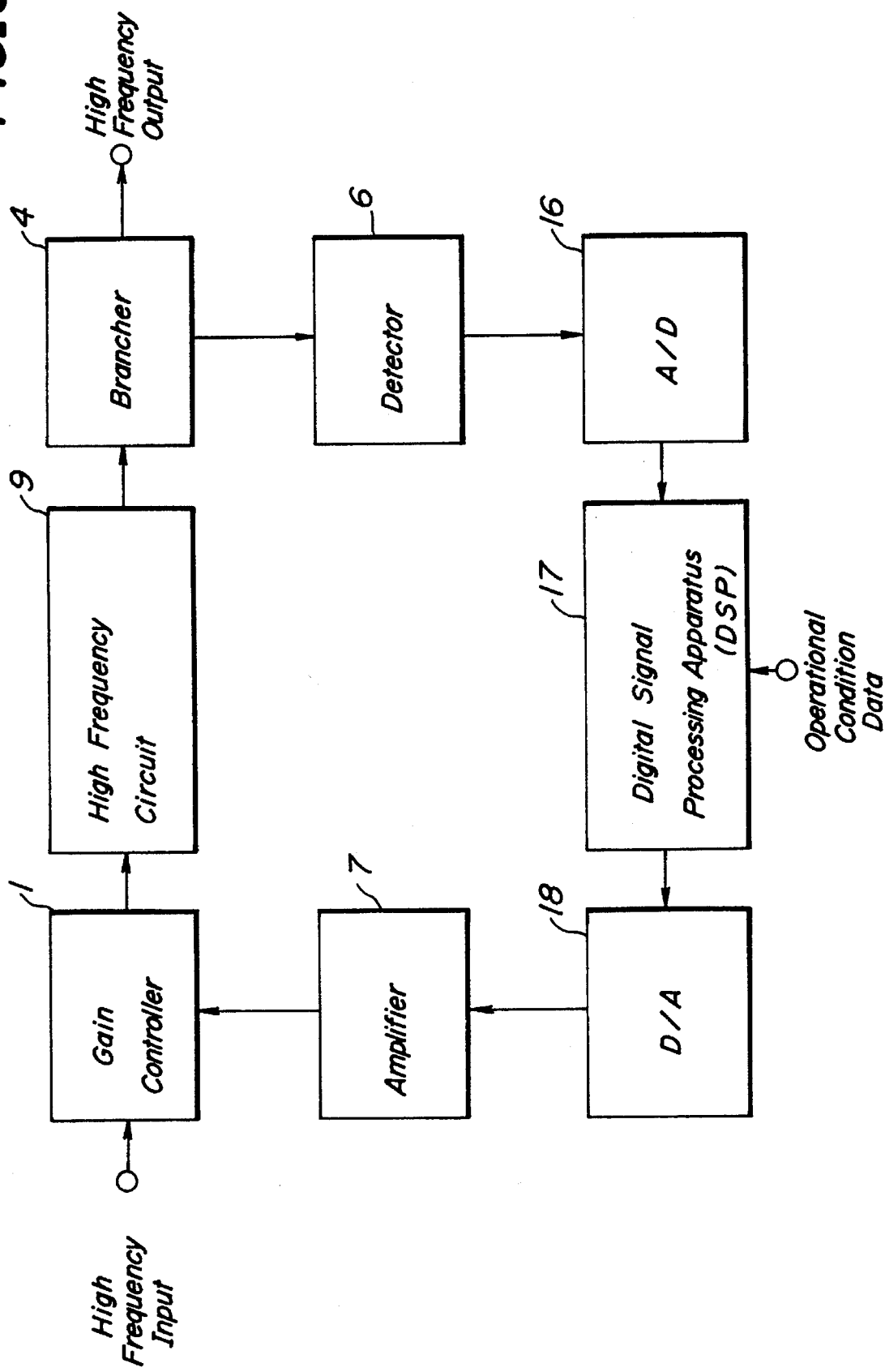
FIG. 5 is a block diagram showing another example of the same.

In the circuit arrangement according to the present invention, for attaining the above rapid processing of operational condition data, in place of microprocessors which have been conventionally employed for successively effecting data-processings in general, a digital signal processing apparatus, that is, so-called DSP (Digital Signal Processor) is employed, so as to compose the circuit arrangement, for instance, as outlined in FIG. 5.

The digital signal processing apparatus of this kind (DSP) is a general term of the apparatus which comprises necessary plural random access memories (RAM) and read only memories (ROM) connected with digital operating circuits in each stages through multi-bit data buses, so as to effect necessary data processings as parallelly as possible and hence to facilitate the completion of data processing which is extremely rapid in comparison with the conventional microprocessor in general. In case that this DSP is employed in the circuit arrangement of the present invention, all of the adaptive filter 10, the data analyzer 11, the memory 12, the comparator (correlator) 13, the adjudicator 14 and the coefficient setter 15, as indicated by surrounding with a chain line in the outlined arrangement as shown in FIG. 4 are entirely digitized, so as to be rearranged in the form of the digital signal processing apparatus (DSP) 17, and further to provide the preceding analog to digital converter (A/D) 16 and the subsequent digital to analog converter (D/A) 18 together therewith.

As is apparent from the described above, according to the present invention, as for the rectification feedback circuit provided for effecting sharp cut-off outside of the transmission band of each channel in the intermittent communication of sounds, data and others through plural narrow band transmission channels allotted close to each other, even if the rectification feedback at large feedback rate is effected, so as to obtain large band attenuation, it is possible to attain stable operation with the desired transmission band characteristic throughout the entire interval from the beginning of the intermittent transmission, regardless of the variation of operational conditions including operational temperature, so that it is possible to obtain an especially evident effect such that there is no interference at all even between closely allotted adjacent channels.

What is claimed is:

1. A rectification feedback circuit comprising:
   a first circuit, having an input to output frequency characteristic, which receives an input signal and outputs an output signal in accordance with said input to output frequency characteristic;
   a second circuit, connected to receive the output signal of said first circuit, which branches the output signal of said first circuit into a transmission output and a feedback signal;
   a third circuit, connected to receive said feedback signal, which detects a characteristic of said feedback signal and generates an adjustment signal;
   a fourth circuit including an input terminal for receiving operational condition data regarding operating conditions of said rectification feedback circuit, said fourth circuit generating a control signal in accordance with said operational condition data; and
   a fifth circuit comprising an adaptive filter connected to receive said adjustment signal and said control signal, said adaptive filter having a passband that is varied in response to said control signal, said fifth circuit being connected to said first circuit, wherein said input to output frequency characteristic of said first circuit is varied in response to variation in said passband of said adaptive filter.

2. A rectification feedback circuit as claimed in claim 1, wherein said adaptive filter comprises a low pass filter.

3. A rectification feedback circuit as claimed in claim 1, wherein said operational data comprises data relating to an operational temperature of said rectification feedback circuit.

4. A rectification feedback circuit as claimed in claim 1, wherein said operational data comprises data relating to an applied voltage of said rectification feedback circuit.

5. A rectification feedback circuit as claimed in claim 4, wherein said operational data further comprises data relating to an operational temperature of said rectification feedback circuit.

6. A rectification feedback circuit as claimed in claim 1, wherein said first circuit comprises:
   a gain controller having an input end for receiving said input signal and an output end; and
   a high frequency circuit having an input end connected to said output end of said gain controller and an output end connected to said second circuit.

7. A rectification feedback circuit as claimed in claim 6, wherein said gain controller comprises an attenuator.

8. A rectification feedback circuit as claimed in claim 6, wherein said high frequency circuit comprises a modulation circuit and a modulation output amplifying circuit.

9. A rectification feedback circuit as claimed in claim 6, wherein said high frequency circuit comprises a high frequency amplifier.

10. A rectification feedback circuit as claimed in claim 1, wherein said fourth circuit further comprises:

a memory which stores the operational data; and a comparator for comparing current operational data with stored operational data, wherein said fourth circuit, responsive to said rectification feedback circuit being intermittently stopped and restarted, generates said control signal during a period immediately following restart of the rectification feedback circuit based on stored operational data received prior to the stopping of the rectification feedback circuit.

11. A rectification feedback circuit as claimed in claim 10, wherein said fourth circuit further comprises:

an adjudicator, operatively associated with said comparator, which determines whether the current operational data has any correlation to the stored operational data, and when said adjudicator determines that there is no correlation, the adjudicator outputs a signal to control said rectification feedback circuit to cease operation.

12. A rectification feedback circuit as claimed in claim 11, wherein said fourth circuit comprises a digital signal processing apparatus comprising a plurality of memory means provided for parallel processing of data for processing said operational data wherein the control of the input to output frequency characteristic of said first circuit can be rapidly effected in real time.

13. A rectification feedback circuit as claimed in claim 1, wherein said first circuit comprises a high frequency amplifier.

14. A rectification feedback circuit as claimed in claim 13, wherein said fourth circuit further comprises:

a memory which stores the operational data; and a comparator for comparing current operational data with stored operational data, wherein said fourth circuit, responsive to said rectification feedback circuit being intermittently stopped and restarted, generates said control signal during a period immediately following the restart of the rectification feedback circuit based on stored operational data received prior to the stopping of the rectification feedback circuit.

15. A rectification feedback circuit as claimed in claim 14, wherein said fourth circuit further comprises:

an adjudicator, operatively associated with said comparator, which determines whether the current operational data has any correlation to the stored operational data, and when said adjudicator determines that there is no correlation, the adjudicator outputs a signal to control said rectification feedback circuit to cease operation.

16. A rectification feedback high frequency circuit as claimed in claim 15, wherein said fourth circuit comprises a digital signal processing apparatus comprising a plurality of memory means provided for parallel processing of data for processing said operational data and the control of the input to output frequency characteristic of said high frequency signal circuit can be rapidly effected in real time.

17. A rectification feedback circuit as claimed in claim 1, wherein said first circuit comprises a modulating circuit and a modulation output amplifying circuit.

18. A rectification feedback circuit as claimed in claim 17, wherein said fourth circuit further comprises:

a memory which stores the operational data; and a comparator for comparing current operational data with stored operational data, wherein said fourth circuit, responsive to said rectification feedback circuit being intermittently stopped and restarted, generates said control signal during a period immediately following the restart of the rectification feedback circuit based on stored operational data received prior to the stopping of the rectification feedback circuit.

19. A rectification feedback circuit as claimed in claim 18, wherein said fourth circuit further comprises:

an adjudicator, operatively associated with said comparator, which determines whether the current operational data has any correlation to the stored operational data, and when said adjudicator determines that there is no correlation, the adjudicator outputs a signal to control said rectification feedback circuit to cease operation.

20. A rectification feedback high frequency circuit as claimed in claim 19, wherein said fourth circuit comprises a digital signal processing apparatus comprising a plurality of memory means provided for parallel processing of data for processing said operational data and the control of the input to output frequency characteristic of said high frequency signal circuit can be rapidly effected in real time.

\* \* \* \* \*